United States Patent
Straeussnigg et al.

(10) Patent No.: US 10,244,315 B2
(45) Date of Patent: Mar. 26, 2019

(54) CIRCUIT ARRANGEMENT WITH AN OPTIMIZED FREQUENCY RESPONSE AND METHOD FOR CALIBRATING A CIRCUIT ARRANGEMENT

(71) Applicant: Infineon Technologies AG, Neubiberg (DE)

(72) Inventors: Dietmar Straeussnigg, Villach (AT); Alessandro Caspani, Villach (AT); Elmar Bach, Villach (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/706,825

(22) Filed: Sep. 18, 2017

(65) Prior Publication Data

US 2018/0084343 A1    Mar. 22, 2018

(30) Foreign Application Priority Data

Sep. 19, 2016 (DE) .................. 10 2016 117 587

(51) Int. Cl.
*H04R 3/04*  (2006.01)
*G01P 21/00*  (2006.01)
(Continued)

(52) U.S. Cl.
CPC ................. *H04R 3/04* (2013.01); *B81B 7/02* (2013.01); *G01P 21/00* (2013.01); *H04R 5/027* (2013.01);
(Continued)

(58) Field of Classification Search
CPC ... H04R 3/04; H04R 3/06; H04R 3/08; H04R 3/10; H04R 3/005; H04R 19/04; H04R 2201/003; H04R 2201/401; H04R 2499/11; H04R 5/027; H04R 1/22; B81B 7/02; G01P 21/00
(Continued)

(56) References Cited

U.S. PATENT DOCUMENTS 8,218,779 B2   7/2012  Isberg
8,433,075 B2   4/2013  Elko et al.
(Continued)

FOREIGN PATENT DOCUMENTS

DE     102008062972 A1    6/2010

*Primary Examiner* — William A Jerez Lora
(74) *Attorney, Agent, or Firm* — Viering, Jentschura & Partner MBB

(57) ABSTRACT

In various embodiments, a circuit arrangement includes a calibration filter set up to receive a signal based on a first signal and to provide a calibrated signal, the first signal being a signal which is provided by an analog/digital converter and is based on an analog signal, the analog signal being provided by at least one sensor of a sensor arrangement, a filter arrangement set up to receive a signal based on the first signal and to provide a second signal, and a controller set up to select a sensor-specific control signal dependent on the frequency response of the sensor from a plurality of control signals and to provide the calibration filter with said signal, the calibrated signal being based on the first signal and the sensor-specific control signal and corresponding or substantially corresponding to a predefined spectral mask in a predefined frequency range.

25 Claims, 10 Drawing Sheets

(51) Int. Cl.
  *H04R 5/027*   (2006.01)
  *B81B 7/02*    (2006.01)
  *H04R 29/00*   (2006.01)
  *H04R 1/22*    (2006.01)
  *H04R 19/04*   (2006.01)
  *H04R 3/00*    (2006.01)

(52) U.S. Cl.
  CPC ............ *H04R 29/004* (2013.01); *H04R 1/22* (2013.01); *H04R 3/005* (2013.01); *H04R 19/04* (2013.01); *H04R 2201/003* (2013.01); *H04R 2201/401* (2013.01); *H04R 2499/11* (2013.01)

(58) Field of Classification Search
  USPC ................ 381/56, 58, 91, 92, 124, 303, 320
  See application file for complete search history.

(56)                References Cited

U.S. PATENT DOCUMENTS

| 2002/0146136 | A1* | 10/2002 | Carter, Jr. ............ H04R 29/001 381/59 |
| 2003/0108209 | A1  | 6/2003  | McIntosh |
| 2010/0161268 | A1  | 6/2010  | Gotffriedsen et al. |
| 2011/0051953 | A1* | 3/2011  | Makinen ................ H04R 1/406 381/92 |
| 2012/0269356 | A1* | 10/2012 | Sheerin ................ H04R 29/004 381/58 |
| 2013/0170666 | A1* | 7/2013  | Ng ...................... H04R 29/006 381/92 |
| 2016/0167961 | A1  | 6/2016  | Dar et al. |
| 2016/0241961 | A1  | 8/2016  | Josefsson |
| 2016/0345107 | A1* | 11/2016 | Van Dijk ............. H04R 25/505 |

* cited by examiner

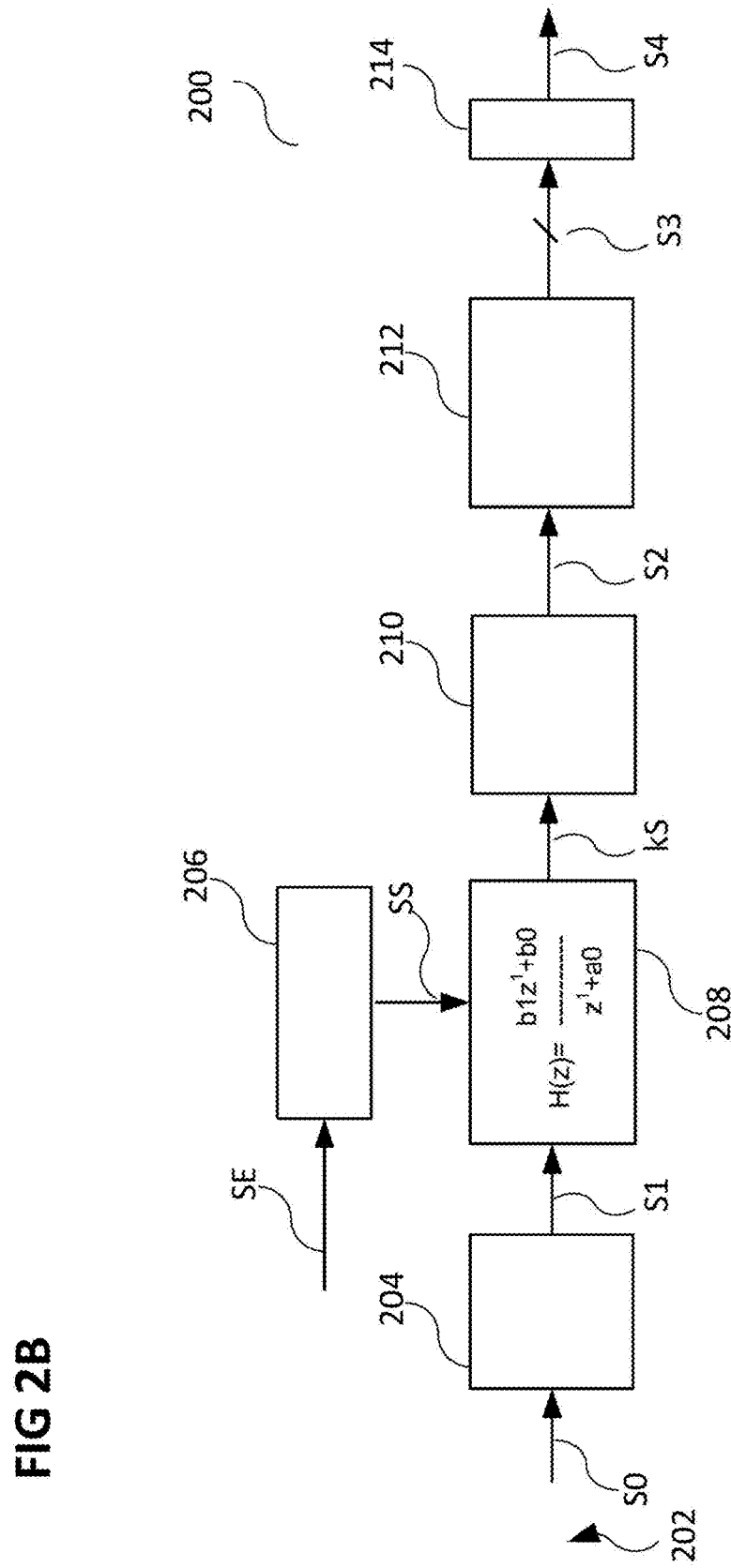

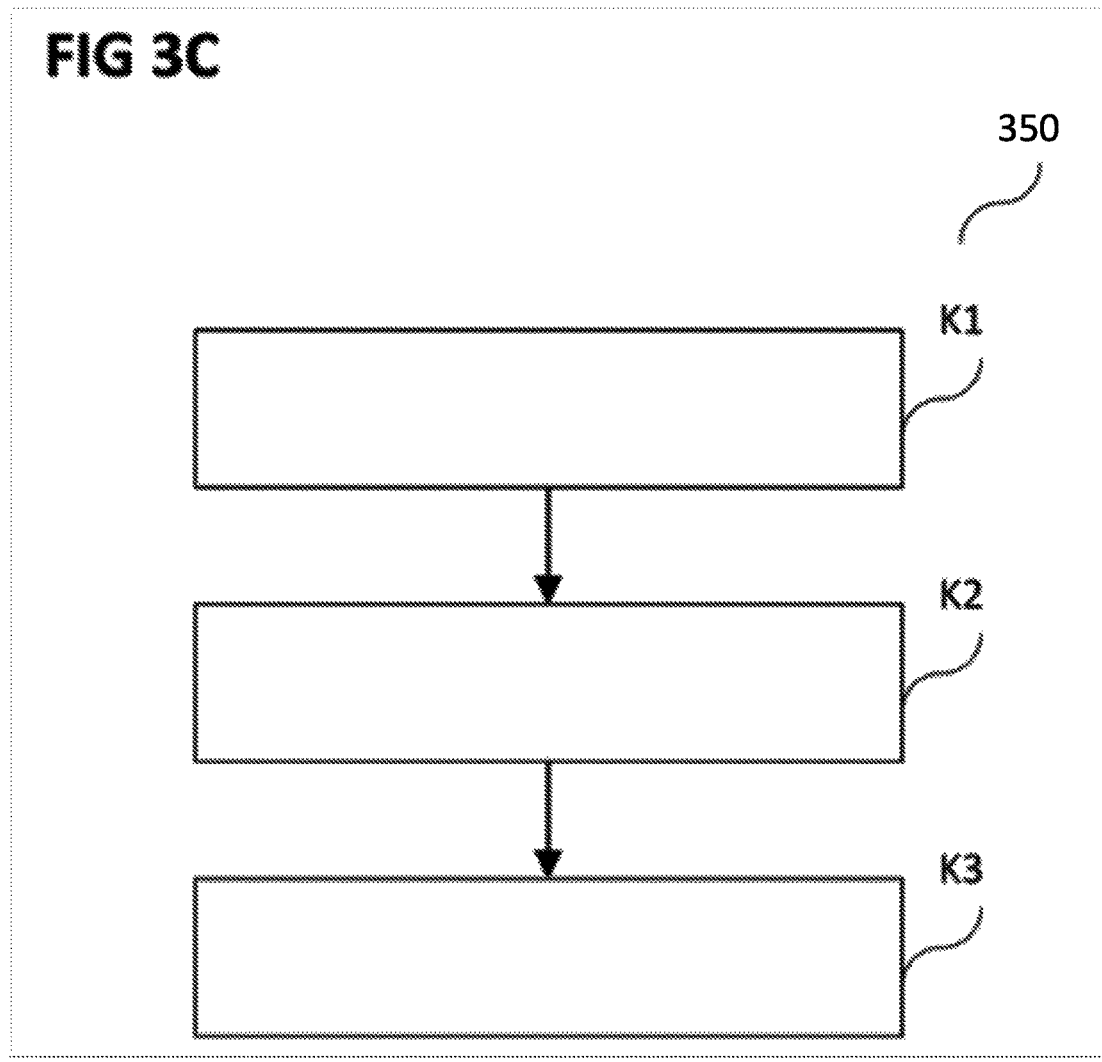

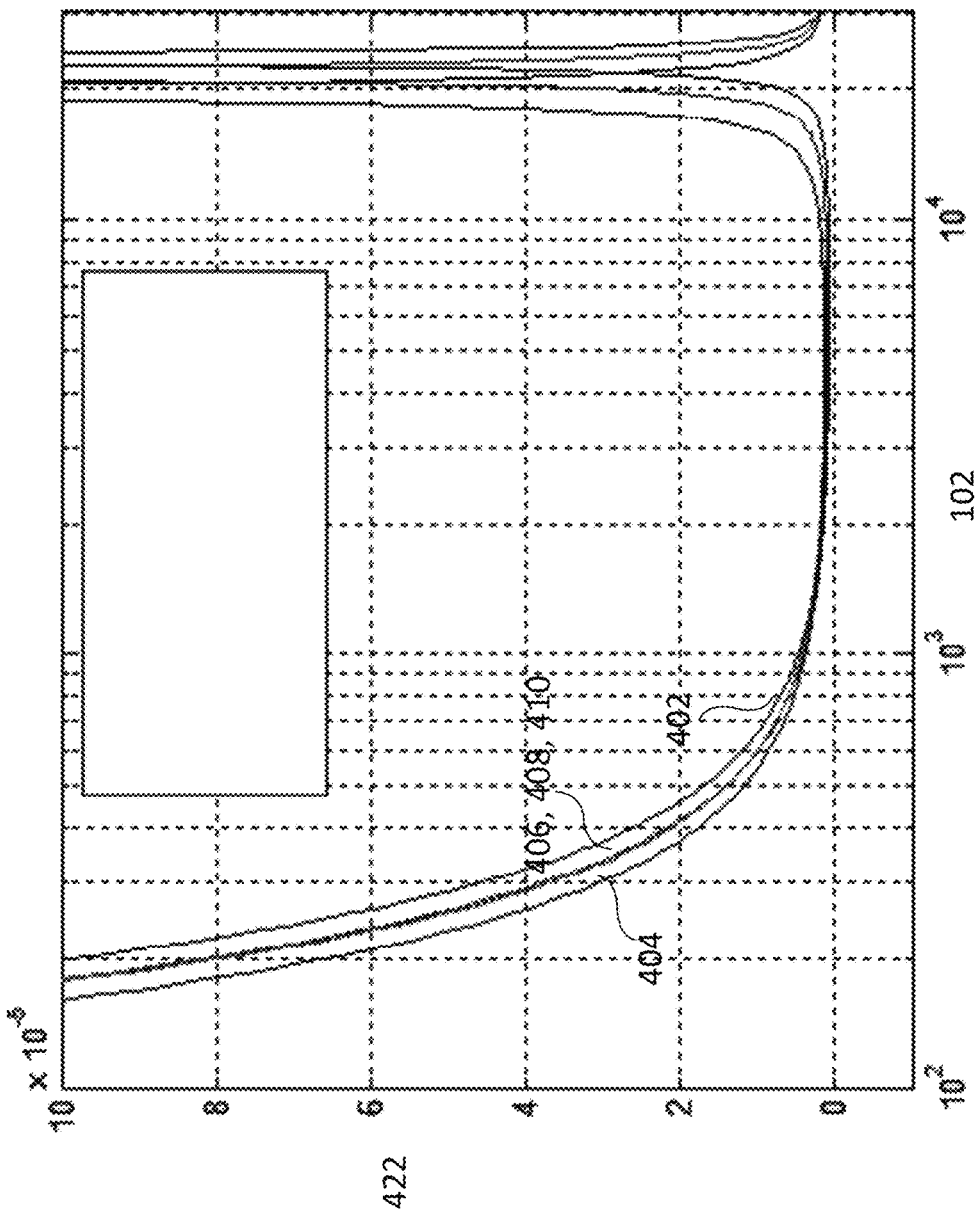

CIRCUIT ARRANGEMENT WITH AN OPTIMIZED FREQUENCY RESPONSE AND METHOD FOR CALIBRATING A CIRCUIT ARRANGEMENT

CROSS-REFERENCE TO RELATED APPLICATION

This application claims priority to German Patent Application Serial No. 10 2016 117 587.0, which was filed Sep. 19, 2016, and is incorporated herein by reference in its entirety.

TECHNICAL FIELD

Various embodiments relate generally to a circuit arrangement with an optimized frequency response and to a method for calibrating a circuit arrangement.

BACKGROUND

Sensor arrangements, for example microphones, are used to record ambient noises or ambient sound. In order to provide a good quality of the recorded sound or in order to meet requirements of customers, a high degree of linearity, high signal-to-noise ratios (SNR) or the correspondence with a predefined spectral mask may be required for the response function of a microphone.

As is illustrated in the block diagram in FIG. 5, a conventional microphone 500 has a microphone diaphragm 502, for example a micro-electromechanical diaphragm (MEMS). The diaphragm 502 is deflected from a rest position by means of sound-induced pressure fluctuations and in the process generates an analog electrical signal which is amplified by means of an amplifier 504 or a read-out circuit, for example a source follower. The signal from the amplifier 504 is detected by a sensor circuit 506 at a sampling frequency Fs (510). The sensor circuit 506 has an analog/digital converter 512 which converts the signal from the amplifier 504 into digital signals. The sensor circuit also has a digital filter 514 which blocks high-frequency digital signals from the analog/digital converter 512 (low-pass filter). The filtered digital signals are converted into a customer-specific one-bit output signal 508 by a modulator 516 which is connected to the digital filter 514.

The low-pass filter is needed to stabilize the arrangement and to attenuate an excessive increase in the MEMS frequency response. A group delay is associated with this arrangement.

Owing to process variation and package variation, real microphones have a considerable variation in the frequency response. FIG. 1 shows a graph 100 in which the amplitude response 104 in units of dB is shown on the basis of the frequency 102 of the signals for different microphones 106, 108, 110 of the same design. It is clear from FIG. 1 that the lower frequency range, which is determined by the acoustic high-pass filter, is affected, in particular.

In some applications, ambient noises are recorded and evaluated at the same time using a plurality of microphones. For this purpose, the plurality of microphones are each arranged in a microphone array (MIC array) at a distance in a specific arrangement with respect to one another. As a result, a sound wave arrives at the individual microphones with a temporal offset. In order to make it possible to precisely evaluate the signals recorded by the microphones, the individual microphones should not have any fluctuations or should have only slight fluctuations in the frequency response with respect to one another. The frequency response implies no or only slight fluctuations in the amplitude response, phase response and the group delay of the recorded signals. The lower frequency range, for example up to approximately 4 kHz, is very important for such applications.

An attempt is currently being made, by means of circuitry measures, to keep the variation in the frequency responses of the individual microphones as low as possible. However, limits are imposed on this approach or signify a corresponding additional outlay.

SUMMARY

In various embodiments, a circuit arrangement includes a calibration filter set up to receive a signal based on a first signal and to provide a calibrated signal, the first signal being a signal which is provided by an analog/digital converter and is based on an analog signal, the analog signal being provided by at least one sensor of a sensor arrangement, a filter arrangement set up to receive a signal based on the first signal and to provide a second signal, and a controller set up to select a sensor-specific control signal dependent on the frequency response of the sensor from a plurality of control signals and to provide the calibration filter with said signal, the calibrated signal being based on the first signal and the sensor-specific control signal and corresponding or substantially corresponding to a predefined spectral mask in a predefined frequency range.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIGS. 2A and 2B show block diagrams of circuit arrangements according to various embodiments;

FIG. 3C shows a flowchart of a method for calibrating a circuit arrangement according to various embodiments;

FIG. 4C shows a graph of the group delay of a calibrated circuit arrangement according to various embodiments.

DESCRIPTION

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

Various embodiments which are used as an example are now described more completely with reference to the attached drawing which illustrates some embodiments which are used as an example. In the figures, the thicknesses of lines, layers and/or areas may be exaggerated for reasons of clarity.

Even though further embodiments may accordingly have various modifications and alternative forms, some embodiments thereof which are used as an example are illustrated by way of example in the figures and are described here in detail. However, it should be understood that there is no intention to restrict embodiments used as an example to the specific forms disclosed, but rather embodiments used as an example are intended, on the contrary, to cover all modifications, equivalent configurations and alternatives which fall within the scope of protection of the invention. Identical numbers in the description of the figures relate to identical or similar elements.

Within the scope of this description, the terms "linked", "connected" and "coupled" are used to describe both a direct and an indirect link, a direct or an indirect connection and direct or indirect coupling. In the figures, identical or similar elements are provided with identical reference symbols provided that this is expedient.

The terminology used here is used only to describe specific embodiments used as an example and is not provided in a manner restricting further embodiments used as an example. In this case, the singular forms "a", "an", "of a/an" and "the" are also intended to include the plural forms unless clearly indicated otherwise by the context. It is also noted that the terms "comprises", "comprising", "has" and/or "having", if used here, specify the presence of mentioned features, integers, steps, operations, elements and/or components, but do not exclude the presence or the addition of one or more other features, integers, steps, operations, elements, components and/or groups thereof.

Various embodiments provide a circuit arrangement with an optimized frequency response and a method for calibrating a circuit arrangement.

Figure 2A:
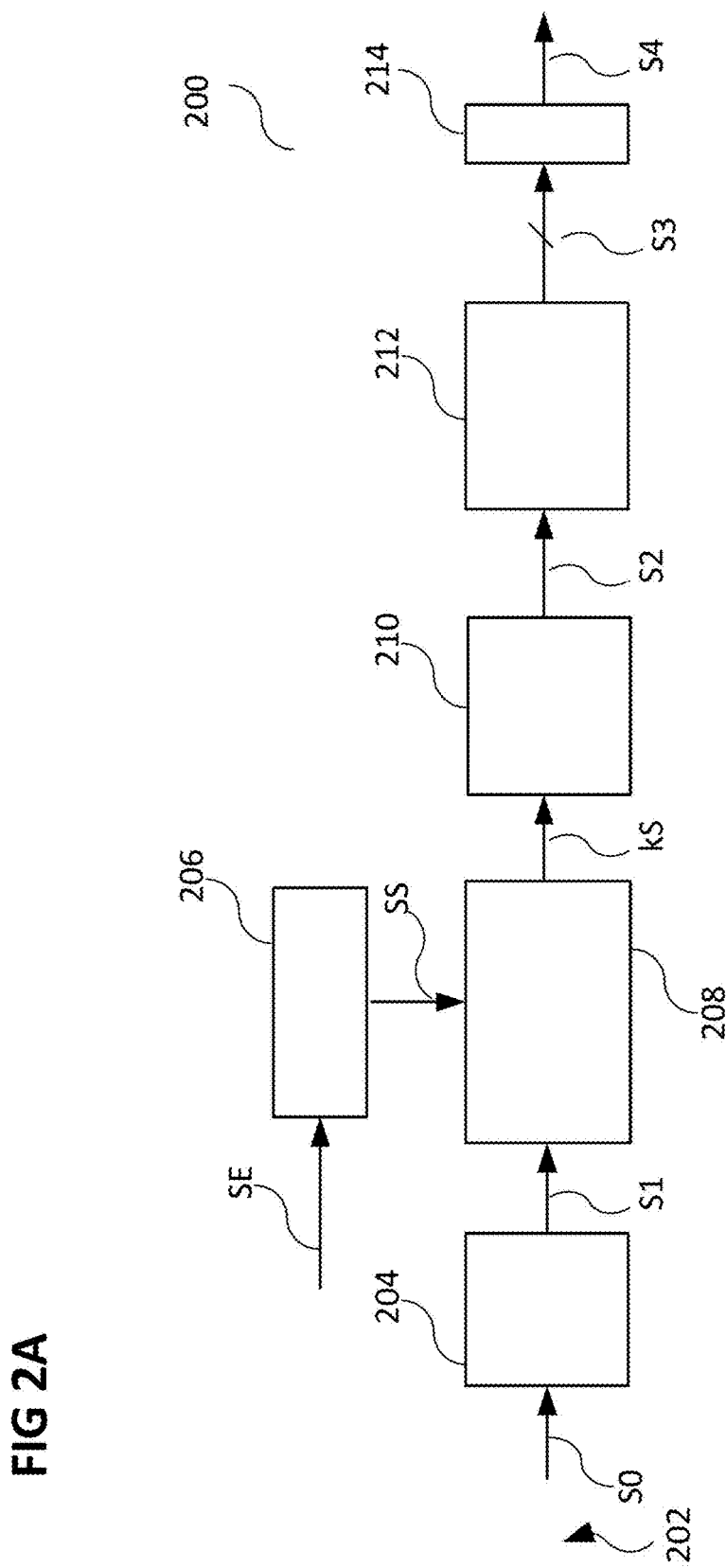

FIGS. 2A and 2B show block diagrams of circuit arrangements according to various embodiments. FIG. 2A illustrates a block diagram of a section 200 of an embodiment of a circuit arrangement according to various embodiments. FIG. 2B also shows, in further details, a calibration filter 208 in the form of a first-order programmable recursive filter. The calibration filter is part of a described circuit arrangement according to various embodiments.

In various embodiments, the circuit arrangement 200 has a sensor arrangement having at least one sensor 202; an analog/digital converter 204, a calibration filter 208, a filter arrangement 210 and a control unit 206 which are described in more detail below.

Figure 1:
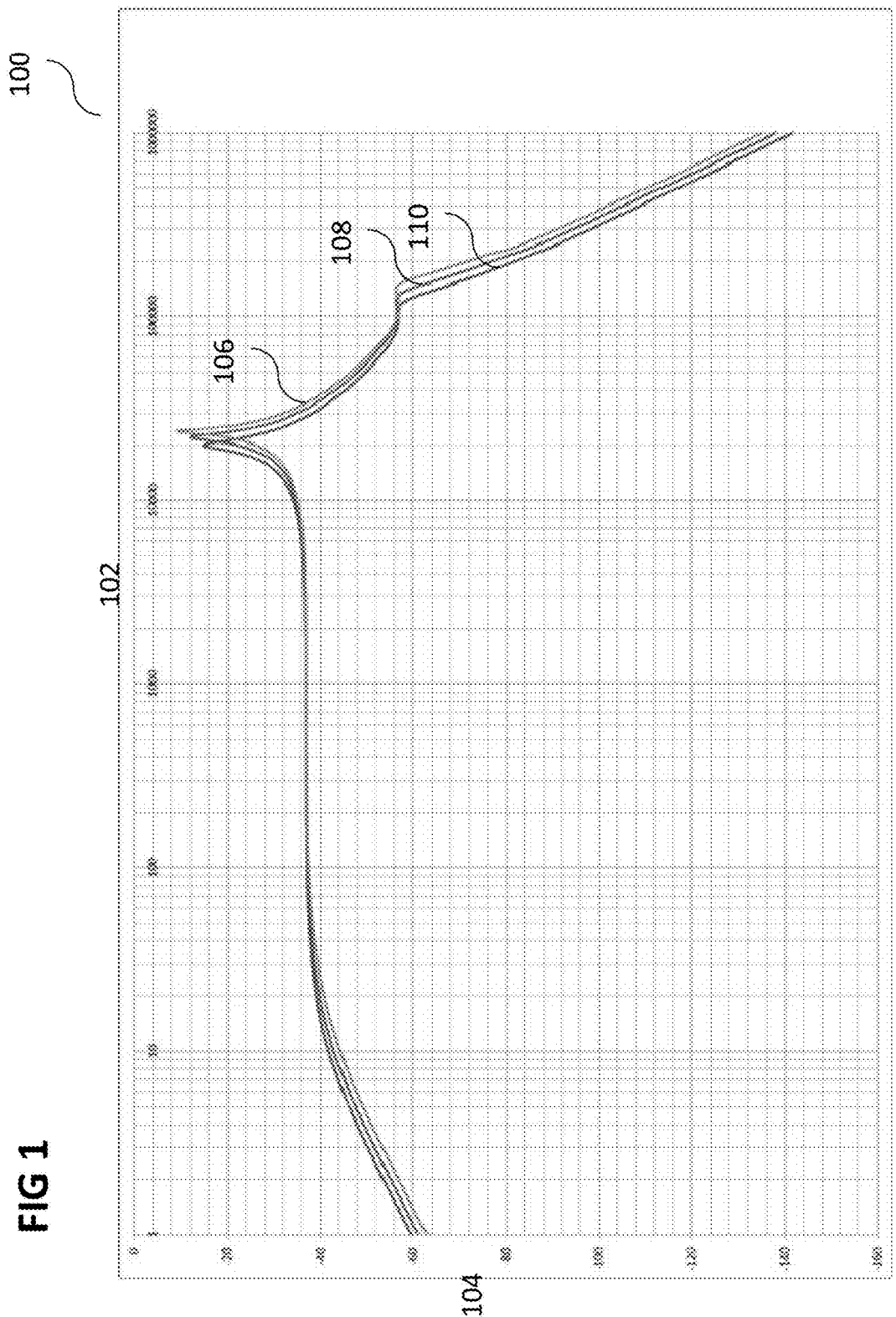
FIG. 1 shows a graph of the amplitude response of a sensor arrangement without calibration.

Some of the properties of the sensor arrangement which relate the signal S4 provided by the circuit arrangement to the pressure acting on a pressure sensor 202, for example, may be adjusted by hardware properties of the sensor 202 itself, for example the rear volume or the rigidity of a diaphragm in a microphone. However, fluctuations typical of the design remain in the frequency response of the sensors—as illustrated in FIG. 1.

The calibration filter 208 is set up to be programmable, with the result that the frequency response of the sensors of the sensor arrangement can correspond or can substantially correspond to the predefined spectral mask in each case. In this case, the sensor arrangement can be calibrated in a sensor-specific manner, in a manner individual to the sensor or for a group of sensors with similar properties. The error in the sensor arrangement or the deviation from the predefined spectral mask can be measured or estimated in this case. On the basis of this, a set of filter coefficients can be selected from two or more sets of filter coefficients (also referred to as a control signal) for the calibration filter 208 and the calibration filter 208 can be accordingly programmed. The selection is made in such a manner that the calibrated signal on average has the smallest possible deviation from the predefined spectral mask in a predefined frequency range, for example in a range of 100 Hz to 4 kHz, for example in a range of ±3% around the respective value of the spectral mask. The amplitude error, phase error or group delay error can be used as the error signal, for example.

Figure 4A:
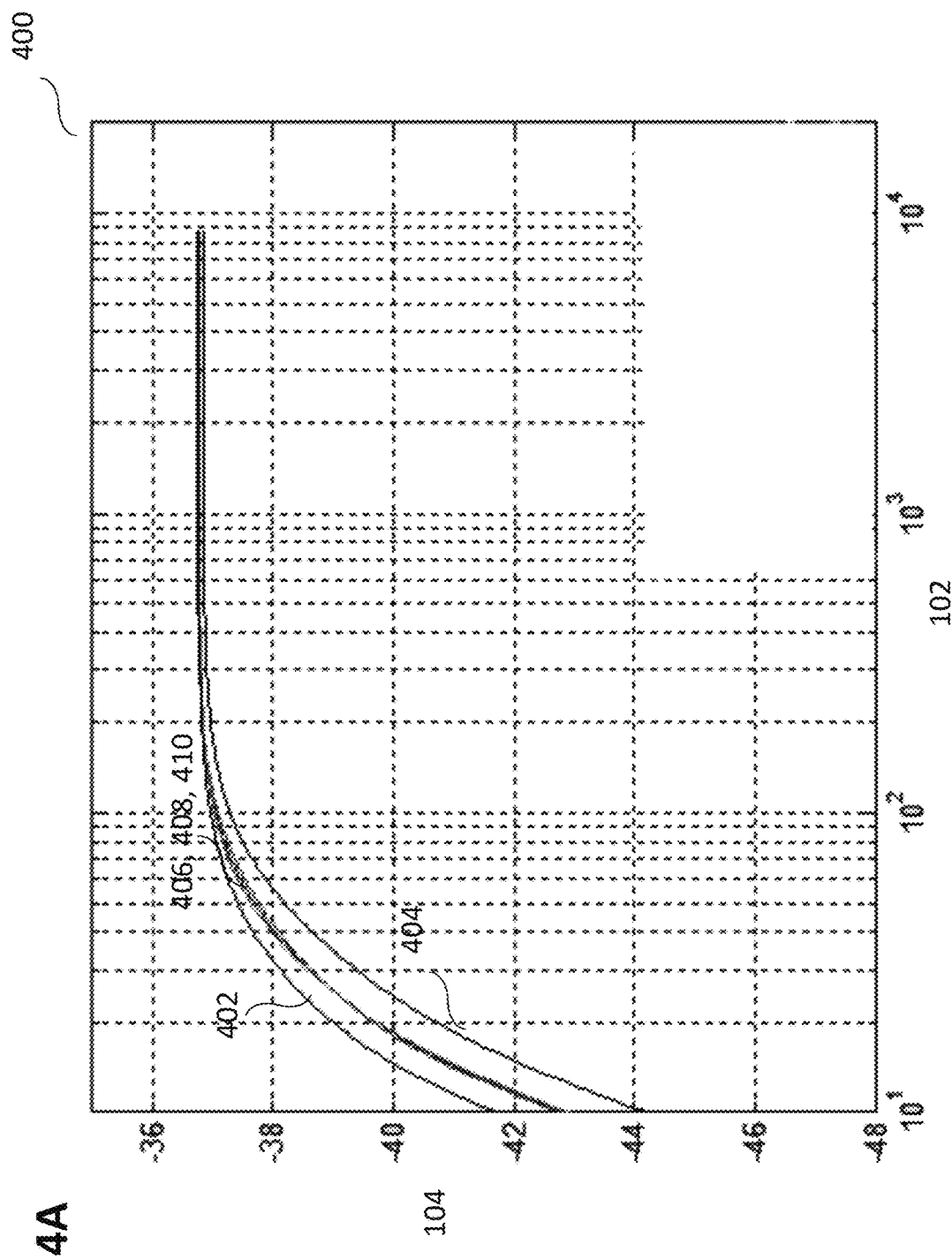
FIG. 4A shows a graph of the amplitude response of a calibrated circuit arrangement according to various embodiments.
Figure 4B:
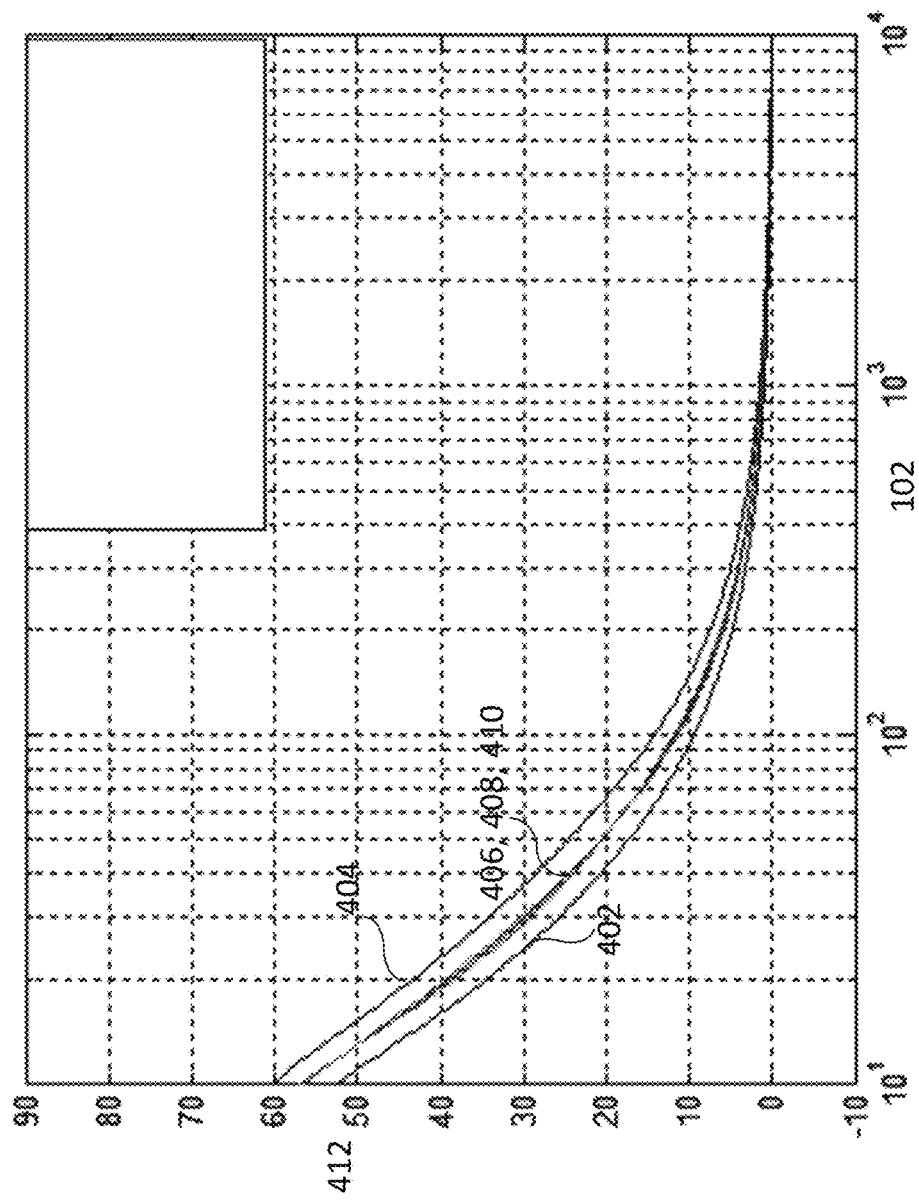
FIG. 4B shows a graph of the phase response of a calibrated circuit arrangement according to various embodiments.
Figure 5:
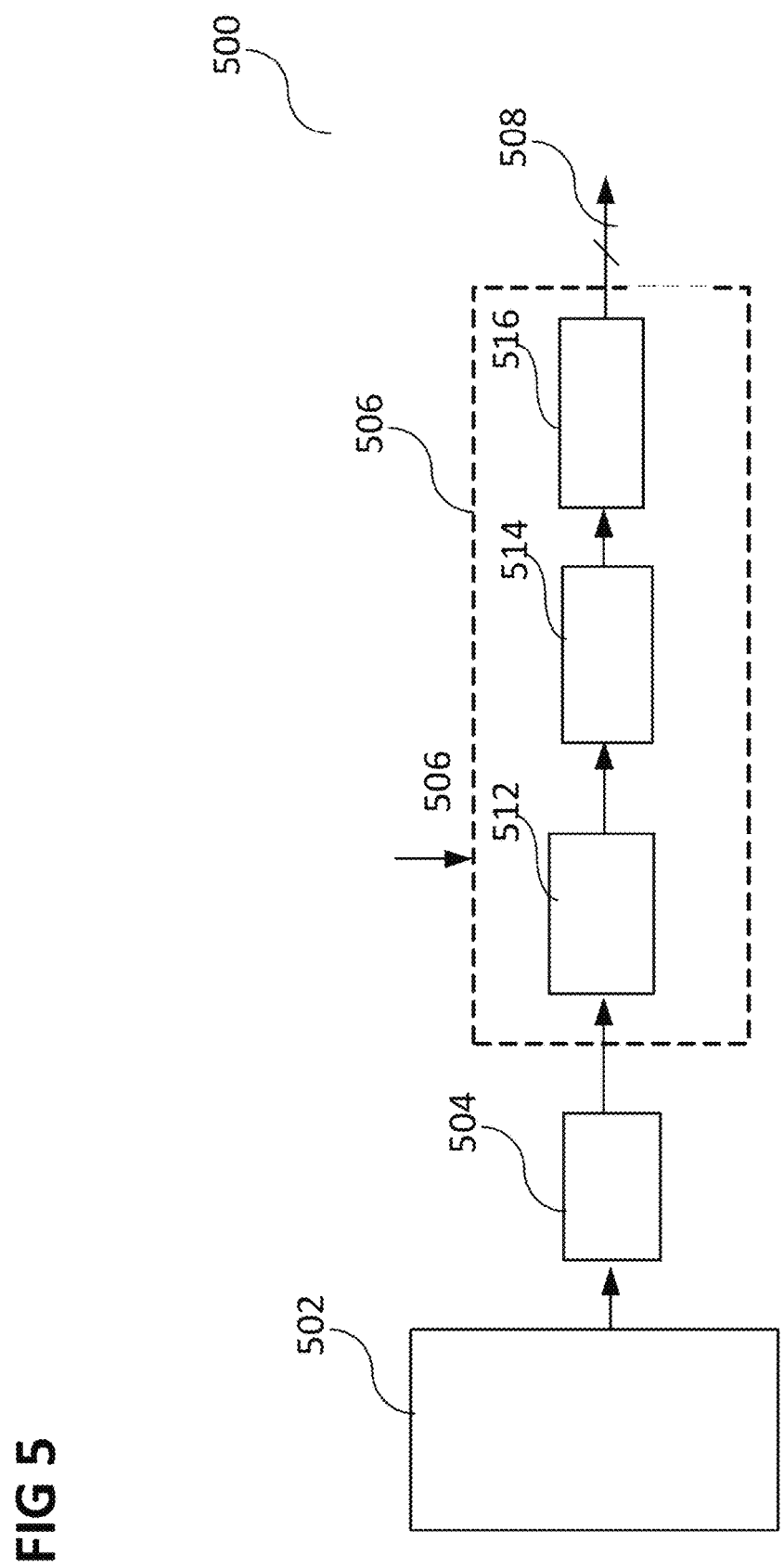
FIG. 5 shows a block diagram of a conventional microphone.

Clearly, the circuit arrangement 200 having the calibration filter based on a respective sensor-specific control signal makes it possible to optimize the frequency response with respect to a predefined spectral mask. This makes it possible to compensate for the fluctuations typical of the design of the sensors 202 in the frequency response, for example in the low-frequency signal range, as illustrated in FIGS. 4A-C, which can be understood as optimization of the frequency response.

The circuit arrangement 200 is in the form of a pressure sensor arrangement or a microphone arrangement, for example. The microphone arrangement may have an arrangement of one or more microphones. In this case, the microphones are set up as sensors 202 of the sensor arrangement.

In various embodiments, the circuit arrangement 200 is used to record ambient sound, voice, music or the like and to provide a signal S4 based thereon. The recording or provision of a signal can be understood as providing an electrical signal which depends on the ambient sound or, in other words, on the sound pressure acting on the microphone. Various microphone types can be used, for example electret microphones or other condenser microphones. A special example is a silicon microphone implemented as a micro-electromechanical system. That is to say, the diaphragm and other components which form the microphone can be produced using processing steps and techniques which are usually used in microprocessor production.

Correspondence or substantial correspondence of the frequency response of the signal to a predefined spectral mask means that the amplitude gain, the phase angle and/or the group delay of the signal from the sensor at a frequency correspondo the predefined value of the spectral mask at this frequency, that is to say is/are identical (for example taking into account rounding rules and measurement errors), or is/are within a range around this value, that is to say the respective value of the signal may deviate slightly from the value of the spectral mask. The value of the signal substantially corresponds, for example, to the value of the spectral mask if it is in a range of approximately ±10%, for example ±5%, around the value of the spectral mask, for example.

If the signal received by a filter is based on another provided signal, this should be understood as meaning that the received signal is identical to the provided signal or the provided signal is initially also processed in a different manner, for example by a different filter, before it is received by the filter.

The at least one sensor is set up to provide an analog signal S0. The sensor arrangement may have a plurality of sensors 202. The sensors 202 each provide an analog signal S0. At least one signal S0 from a sensor 202 is changed with respect to the predefined spectral mask. Furthermore, the signals S0 from a plurality of sensors 202 of the sensor arrangement may be changed with respect to a common predefined spectral mask, that is to say with respect to the same spectral mask.

At least one sensor 202 of the sensor arrangement may have a diaphragm, a deflection of the diaphragm from a rest position generating the analog signal S0. The diaphragm is, for example, a micro-electromechanical structure (MEMS) or has such a structure. Alternatively or in other words, the sensor may be or have a micro-electromechanical structure.

The analog/digital converter 204 is set up to receive the analog signal S0 and to provide a first signal S1. Optionally, the analog signal S0 from the sensor may be amplified by means of an amplifier, for example a source follower, before it is received by the analog/digital converter 204. The analog/digital converter 204 may be a multi-bit converter, with the result that the first signal S1 is a multi-bit representation. The analog/digital converter is, for example, a sigma-delta analog/digital converter, for example a third-order analog/digital converter.

The sampling frequency of the analog/digital converter 204 may be variable, with the result that a plurality of sampling frequencies can be supported by the circuit arrangement. According to some embodiments of circuit arrangements used as an example, one property of the sensor arrangement is variable, which can make it possible to achieve similar modification properties of the sensor arrangement for various sampling frequencies of the analog/digital converter 204. The sampling frequency has a value in a range of approximately 1 MHz to approximately 4 MHz, for example.

The control unit 206 is set up to select a sensor-specific control signal SS dependent on the frequency response of the sensor 202 from a plurality of control signals SS and to provide the calibration filter 208 with said signal.

The control unit 206 is, for example, an integrated circuit (IC) or an application-specific integrated circuit (ASIC) or has such a circuit. The control unit may also have a detector circuit or may be connected to the latter in order to detect a sensor-specific property of a sensor 202 connected to the control unit 206.

The calibration filter 208 is set up to receive a signal based on the first signal S1 and to provide a calibrated signal kS. The calibrated signal kS output by the calibration filter 208 also depends on the control signal SS which is based on a property SE detected in a sensor-specific manner.

The calibration filter 208 operates in the time-discrete digital range and, during each processing step, provides a signal kS which has been calibrated with respect to a predefined spectral mask. The calibrated signal depends on the current input signal multiplied by scaling parameters (a0, b0, 1). The input signal may be the first signal S1 provided by the analog/digital converter 204 or may be based on said signal.

The calibration filter 208 may be set up as a programmable digital calibration filter 208. Alternatively or additionally, the calibration filter 208 is set up as a recursive calibration filter 208. The calibration filter 208 has, for example, at least two filter coefficients b0, b1, for example three filter coefficients a0, b0, b1.

The calibration filter is, for example, a programmable digital recursive filter having the transfer function H(z):

$$H(z) = \frac{b1 z^1 + b0}{z^1 + a0}.$$

with b1, b0 and a0 as filter coefficients.

The filter arrangement 210 is set up to receive a signal based on the first signal S1 and to provide a second signal S2. Clearly, the filter arrangement 210 is connected to the analog/digital converter 204, with the result that the signal S1 provided by the analog/digital converter 204 is processed or converted into a signal S2 provided by the filter arrangement 210. For example, the filter arrangement 210 is set up to receive a signal based on the calibrated signal kS, for example the calibrated signal kS, and to provide a second signal S2.

The second signal S2 differs from the calibrated signal and the first signal in at least one frequency range. In various embodiments, the second signal corresponds to the calibrated signal kS in at least one frequency range, that is to say a 1-to-1 representation of the signal is carried out by the filter arrangement or the calibration filter in this frequency range.

The filter arrangement 210 may have, for example, one or more of the following filters or filter functions: a frequency-selective filter, for example a pass filter and/or a rejection filter; a decimation filter, an interpolation filter, a filter for reducing the group delay. The filter arrangement 210 may be set up in a linear and time-invariant manner. Alternatively, the filter arrangement 210 has, for example, a filter for changing the sampling rate, for example a decimation filter and/or an interpolation filter, as a result of which the filter arrangement becomes non-linear. In other words: in various embodiments, the filter arrangement 210 may have a filter which is set up to reduce the group delay of a signal passing through. Alternatively or additionally, the filter arrangement 210 may have a filter or a filter function which is clearly set up as a low-pass filter or a bandpass filter. Alternatively or additionally, the filter arrangement 210 may have a filter or a filter function which clearly changes the sampling rate of the signal, for example in the form of a decimation filter and/or an interpolation filter. The filter arrangement may have one or more filters or filter functions. A plurality of filter functions may be implemented in a common filter. Filter functions are, for example, changing the sampling rate of the received signal, changing the frequency response of the received signal, for example selectively blocking or allowing frequency ranges of the received signal to pass. The filter or the plurality of filters may each be set up in a single-stage or multi-stage manner.

The received and provided signals S1, S2, S3, S4, kS, SS, SE described in yet more detail below may each be a digital signal and may differ from one another.

The calibrated signal kS provided by the calibration filter 208 is based on the first signal S1 provided by the analog/digital converter 204 and the sensor-specific control signal SS provided by the control unit 206. The calibrated signal kS corresponds or substantially corresponds, in a predefined frequency range, to a predefined spectral mask which is described in more detail by way of example in FIGS. 4A-C.

The sensor-specific control signal SS may be dependent on a measured or estimated property of the sensor SE with respect to a predefined amplitude response, a predefined phase response and/or a predefined group delay. The control unit 206 has a memory or is connected to such a memory, for example. The memory stores the plurality of control signals SS. The control unit 206 is set up to select one of the plurality of control signals SS as a sensor-specific control signal SS depending on the measured or estimated property of the sensor SE and to provide the calibration filter 208 with said signal.

The sensor-specific control signal SS may contain a set of filter coefficients or filter coefficients for the calibration filter. Alternatively or additionally, the calibration filter 206 may have a further memory or may be connected to such a memory. This further memory can store a plurality of sets of filter coefficients or filter coefficients for the calibration filter 208. The calibration filter 208 is set up to load a set of filter coefficients from the memory connected to the calibration filter depending on the sensor-specific signal. As a result, the signal which is based on the first signal and is received by the calibration filter can be changed or calibrated with respect to the predefined spectral mask.

The first signal S1 provided by the analog/digital converter 204 may have the same sampling rate as the fourth signal S4 provided by the sensor arrangement in the case of a linear time-invariant behavior of the circuit arrangement. However, the two signals may differ in terms of the amplitude, the phase and the group delay.

The amplitude response is the ratio of the amplitudes of the received signal (input signal) and the provided signal (output signal) on the basis of the frequency. The phase response is the difference in the phase between the input signal and the output signal on the basis of the frequency.

In various embodiments, the circuit arrangement 200 may also have a modulator 212. The modulator is connected to the analog/digital converter 202, the calibration filter 208 and/or the filter arrangement 210. The modulator 212 is set up to provide a third signal S3 based on the calibrated signal kS. The third signal S3 may be based, for example, on the second signal S2, that is to say the modulator 212 is set up to receive a signal based on the second signal S2 and to provide a third signal S3. Alternatively, the second signal S2 is based on the third signal S3.

The signal received by the modulator 212 has a first word width. The modulator 212 is set up to process the signal received by the modulator 212 in such a manner that the third signal S3 provided by the modulator 212 has a second word width. The second word width may be shorter than the first word width; for example, the first word width is greater than 4 bits, for example greater than 8 bits, for example greater than 20 bits; and the second word width is less than 8 bits, for example less than 4 bits, for example 1 bit.

This filter fundamentally has three degrees of freedom, that is to say three coefficients. In the case of a slight deviation of the frequency response from the predefined spectral mask and/or a reduced sampling rate, the coefficient a0 in the denominator of the response function H(z) of the calibration filter may be fixed. This makes it possible for two filter coefficients (b1, b0) to suffice for the calibration filter in order to bring the frequency response of the circuit arrangement more into line with the predefined spectral mask or to make it match.

Figure 3A:
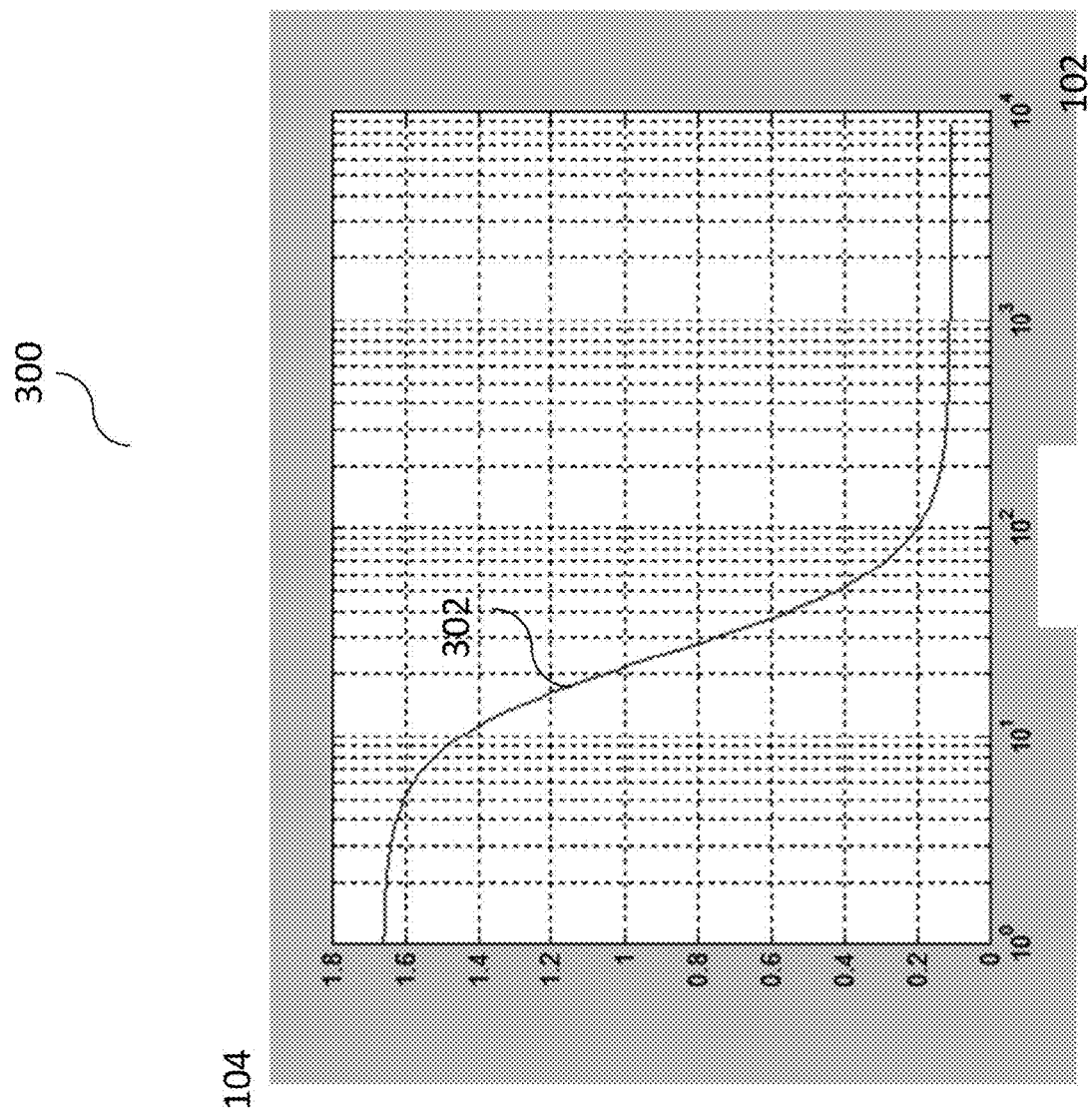
FIGS. 3A and 3B show graphs of the amplitude response of a calibration filter of a circuit arrangement according to various embodiments.

The calibrated signal kS differs from the first signal S1 in at least one frequency range. In various embodiments, the calibrated signal kS corresponds to the first signal S1 in at least one frequency range, for example for frequencies of greater than approximately 10 kHz. In other words, that is to say in this frequency range, the calibration filter 208 carries out a 1-to-1 representation of the signal, as illustrated in FIG. 3A.

Some embodiments used as an example provide a signal S3, S4 in a single-bit representation and may provide this signal by means of the modulator 212 for the purpose of providing the single-bit representation from a multi-bit representation which can be used in preceding processing steps inside the sensor arrangement.

The circuit arrangement 200 may also have an interface 214. The interface 214 is set up to provide a fourth signal S4. The fourth signal S4 is based on the second signal S2 and the calibrated signal kS. The interface 214 may be set up, for example, to receive the third signal S3 and may be set up to provide a fourth signal S4. The fourth signal S4 may be identical to the calibrated signal, the second signal or the third signal.

The interface 214 is set up to provide an environment outside the circuit arrangement with the fourth signal S4 and may have a socket, for example. The interface 214 may be set up, for example, to divide the signal to be output among a plurality of channels or pins. The fourth signal S4 provided by the interface 214 may be provided in any desired different representations. For example, a single-bit protocol can be used, with the result that the fourth signal S4 is provided as a bit stream. Other implementations may provide the fourth signal S4 as a sequence of bits or bytes, for example in the hexadecimal system or in the decimal system. Further embodiments may provide a fourth signal as an analog signal. An acoustic output device and/or an optical output device, for example a loudspeaker or a display, can be connected to the interface 214, for example. The output device may have further filters and/or signal-processing components which further process and change the signal provided at the interface. The fourth signal S4 may be a single-bit signal or a multi-bit signal (also referred to as an m-bit or multi-bit signal).

In other words: in the embodiment illustrated in FIGS. 2A, 2B, the sensor 202 of the sensor arrangement provides the analog signal S0. The analog/digital converter 204 receives the analog signal S0 and provides a first signal S1. The filter arrangement receives a signal based on the first signal S1 and provides the second signal S2. The modulator 212 receives a signal based on the second signal S2 and provides the third signal S3.

A circuit arrangement according to some embodiments used as an example also includes one or more connections in order to make it possible to connect all components inside the sensor arrangement to further circuit arrangements, printed circuit boards or the like in a single assembly step by means of the connection (the connections).

Some embodiments of a circuit arrangement which are used as an example include a common housing arrangement which at least partially encloses the sensor and the further components, for example the amplifier, for example the source follower, the analog/digital converter 204, the filter arrangement 210 and/or the modulator 212, the common housing arrangement having supply connectors for the electrical connection of all components to further circuit arrangements. A circuit arrangement according to some embodiments used as an example can be understood as meaning an individual unit which can be handled as a discrete independent apparatus, with the result that the components inside the circuit arrangements can be connected to further apparatuses or circuit arrangements by electrically connecting the circuit arrangement as a whole to the further circuit arrangements. This can make it possible to reduce the number of connections used inside an application, for example by using a single supply voltage connection for the sensor and the further components inside the housing.

The circuit arrangement 200 may have a digital microphone or an analog microphone, for example. A loudspeaker and/or a voice recognition apparatus, which may be part of the circuit arrangement or can be connected to the latter by means of an interface, may be arranged downstream of the microphone, for example. In other words: the sensor 202, the analog/digital converter 204, the respective filters 208, 210, the control unit 206 and/or the optional modulator 212 can be implemented in one or more apparatuses which can be connected to one another.

In various embodiments, the filter arrangement 210 can receive the first signal S1 provided by the analog/digital converter 204 and can provide a second signal S2 which is received by the calibration filter 208 and—as described above—is calibrated with respect to a predefined spectral mask. In this case, the filter arrangement 210 can change, for example reduce, the sampling rate of the first signal S1. In this case, the circuit arrangement is non-linear and non-time-invariant. Therefore, the filter coefficients differ from those used for the situation in which the filter arrangement 210 is arranged downstream of the calibration filter. As a result of the fact that the filter arrangement 210 is arranged upstream of the calibration filter 208 with regard to the signal flow, the signal changed by the filter arrangement 210 is clearly recalibrated. If the sampling rate of the first signal S1 is reduced by the filter arrangement 210, the calibration of the signal S4 provided at the interface 214 with respect to the predefined spectral mask by the calibration filter can become more efficient or can be simplified.

Figure 3B:
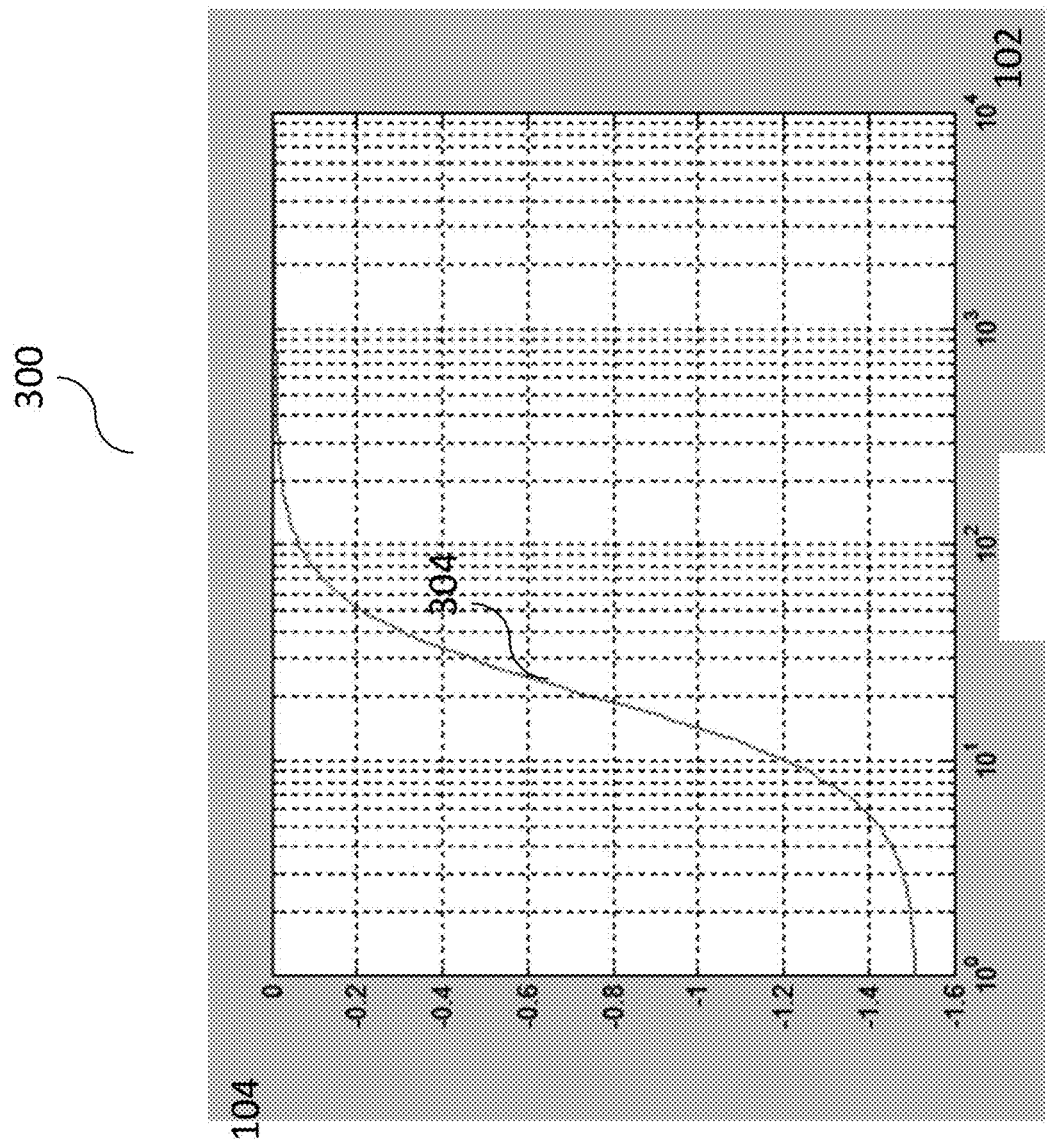

FIG. 3A shows a graph of the amplitude response of a calibration filter of a circuit arrangement according to various embodiments for a high degree of compensation 302, and FIG. 3B shows a graph of the amplitude response of a calibration filter for a low degree of compensation 304.

The x axis shows the frequency 102 in units of Hz and the y axis shows the gain 104 of the amplitude of the signal received by the calibration filter by means of the calibration filter 208 in units of dB. A negative gain corresponds to attenuation of the signal amplitude of the signal passing through the calibration filters 208.

As is clear from FIGS. 3A, B, the calibration filter 208 changes the amplitude of the received signal in the high-pass range, that is to say in the frequency range of approximately 100 Hz to approximately 4 kHz, in order to achieve correspondence with the spectral mask in this frequency range.

A resonant frequency of a sensor of the sensor arrangement, to which the calibration filter 208 is connected, can be arranged in the frequency range between approximately 10 kHz and approximately 30 kHz. In the high-frequency range, for example above approximately 10 kHz, the calibration filter 208 may allow the received signal to pass in unamplified form, in substantially unamplified form or in attenuated form. Allowing the signal received by the calibration filter 208 to pass in unamplified or substantially unamplified form can be understood as meaning a 1-to-1 representation of the received signal to the provided calibrated signal kS in this frequency range, for example apart from a gain which can be attributed to current ripple. Allowing a signal to pass in unamplified or substantially unamplified form may have a gain, for example, in the range of −3 dB to +3 dB in the frequency range.

FIG. 3C shows a flowchart of a method for calibrating a circuit arrangement according to various embodiments.

Various embodiments provide a method 350 for calibrating a circuit arrangement 200. The circuit arrangement 200 has at least one sensor 202 which is set up to provide a signal S0.

The method 350 includes detecting K1 a property SE of a sensor of the sensor arrangement. This may be, for example, the deviation of a signal value of the sensor at a predefined frequency from a predefined signal value, for example the predefined spectral mask, at this frequency.

The method 350 also includes determining K2 a control signal SS from a multiplicity of control signals based on the detected property and a predefined spectral mask. For example, different values and directions of the deviation of the signal value from the predefined value may be correlated with different sets, classes or groups of calibrations, that is to say frequency responses of the calibration filter—as illustrated in FIGS. 3A, B, for example. The control unit can be used to determine which of the available calibrations can be used to minimize the deviation from the predefined spectral mask, for example using an if/then rule. In this case, individual frequency ranges may be given a higher weighting than others.

The method 350 also includes changing K3 the signal based on the sensor signal and made available to the calibration filter, for example the first signal S1, by means of the control signal SS in order to provide a calibrated signal. The control signal causes recursive processing of the provided signal with at least two signal coefficients. After the control signal has been transmitted to the calibration filter, the filter coefficients of the calibration filter are clearly set and are applied to the first signal which is based on the signal S0 from the sensor.

In this case, the filter coefficients may be the control signal or may be implemented in the latter. Alternatively, the calibration filter has a memory or a plurality of registers in which different filter coefficients are stored. The control signal then causes the filter coefficients to be loaded from a particular register into a circuit of the calibration filter. The calibration filter may be set up as an IC (Integrated Circuit) or ASIC (Application-Specific Integrated Circuit), for example.

The method 350 may also include providing K1 an analog signal, converting S1 the analog signal into a digital first signal and processing S3 the first signal to form a second signal, as described in the context of the circuit arrangement.

The method 350 may be carried out, for example, by means of a circuit arrangement described above.

In various embodiments, the deviations which possibly occur are divided into different groups to which a respective control signal, that is to say a set of filter coefficients, is assigned. The deviations in these groups may be a qualitatively and/or quantitatively identical deviation from the predefined spectral mask. In various embodiments, one part of the groups may respectively have a set containing only two filter coefficients, for example if the frequency response of the uncalibrated sensor is already in the vicinity of the predefined spectral mask; and another part of the groups may respectively have a set containing three or more filter coefficients, for example if the frequency response of the uncalibrated sensor is further away from the predefined spectral mask. The frequency responses can be grouped into the respective groups in an application-specific manner, for example depending on the required accuracy of the calibration.

FIGS. 4A-C illustrate the frequency response of a calibrated circuit arrangement according to various embodiments, in which case FIG. 4A illustrates the amplitude response, FIG. 4B illustrates the phase response and FIG. 4C illustrates the group delay. The x axis in FIGS. 4A-C shows the frequency 102 in units of Hz. In FIG. 4A, the y axis shows the gain 104 in units of dB. A negative gain corresponds to attenuation of the signal amplitude of the signal passing through the sensor arrangement. In FIG. 4B, the y axis 412 shows the phase angle in units of degrees. In FIG. 4C, the y axis 422 shows the group delay in units of seconds through the sensor arrangement.

The lower deviation 402 and the upper deviation 404 of sensors of one design from the nominal desired value 406, that is to say the predefined spectral mask, are illustrated in each case. Deviations 402, 404 correspond to the fluctuations which typically occur at most during production of the sensor, as illustrated in FIG. 4A.

With the filter coefficients optimized for the individual limiting cases, the resulting amplitude response in comparison with the non-compensated case is illustrated in FIG. 4A. It is clear that the compensated amplitude responses match the nominal amplitude response, that is to say the predefined spectral mask. FIGS. 4B and 4C shows the same result with respect to the phase response and the group delay.

For example, a first sensor 108 in FIG. 1 complies with the application-specific specification, that is to say corresponds (substantially) to the predefined spectral mask or is the predefined spectral mask. The frequency response of this sensor therefore corresponds to the desired value 406.

A second sensor 106 in FIG. 1 has greater attenuation in the low-frequency signal range, that is to say to approximately 4 kHz, than is provided by the predefined spectral mask. Before calibration, the frequency response of this sensor therefore corresponds to the lower deviation 402. The signal from this sensor is amplified in the low-frequency signal range in order to correspond to the predefined spectral mask 406. FIGS. 4A-C show the frequency response of this sensor after calibration as curves 408. It is scarcely possible to discern a difference between the frequency response 408 of the sensor 106 after calibration and the desired value 406, that is to say the predefined spectral mask, in the predefined frequency range—here in the low-frequency signal range of approximately 100 Hz to approximately 4 kHz.

A third sensor 110 in FIG. 1 has lower attenuation in the low-frequency signal range, that is to say to approximately 4 kHz, than is provided by the predefined spectral mask. Before calibration, the frequency response of this sensor therefore corresponds to the upper deviation 404. The signal from this sensor is attenuated in the low-frequency signal range in order to correspond to the predefined spectral mask 406. FIGS. 4A-C show the frequency response of this sensor after calibration as curves 410. It is scarcely possible to discern a difference between the frequency response 410 of the sensor 106 after calibration and the desired value 406, that is to say the predefined spectral mask, in the predefined frequency range—here in the low-frequency signal range of approximately 100 Hz to approximately 4 kHz.

It is clear from this that the circuit arrangement makes it possible to easily reduce the production-related deviations of the frequency response of a sensor from a predefined frequency response, that is to say a predefined spectral mask in a predefined frequency range. As a result, the frequency response of circuit arrangements having a plurality of microphones can be optimized. This makes it possible to improve the resolution of the circuit arrangement. Alternatively or additionally, the signal-to-noise ratio can be improved.

Example 1 which is illustrated in connection with FIGS. 1 to 4C is a circuit arrangement 200 having a calibration filter 208 which is set up to receive a signal based on a first signal S1 and to provide a calibrated signal kS; the first signal S1 being a signal which is provided by an analog/digital converter 204 and is based on an analog signal S0, the analog signal S0 being provided by at least one sensor 202 of a sensor arrangement; and having a filter arrangement 210 which is set up to receive a signal S1 based on the first signal and to provide a second signal S2; and having a control unit 206 which is set up to select a sensor-specific control signal SS dependent on the frequency response of the sensor from a plurality of control signals SS and to provide the calibration filter 208 with said signal. The calibrated signal kS is based on the first signal S1 and the sensor-specific control signal SS and corresponds or substantially corresponds to a predefined spectral mask in a predefined frequency range.

An interface may be (respectively) arranged between the sensor and the analog/digital converter and/or between the analog/digital converter and the further components described, that is to say the individual components may be implemented in a plurality of physically different apparatuses. Alternatively, these components are implemented in a common apparatus.

The predefined spectral mask may be an application-specific desired specification, for example. Alternatively, the predefined spectral mask may be the determined frequency response of a further sensor of the sensor arrangement.

This makes it possible to reduce the fluctuation or deviation of the frequency response of the sensor in a sensor-specific manner. This makes it possible to improve the precision or resolution of a sensor arrangement having a plurality of sensors.

In example 2, the subject matter according to example 1 may also include the fact that the sensor arrangement has a plurality of sensors 202 which each provide an analog signal S0. At least one signal S0 from a sensor 202 is changed with respect to the predefined spectral mask.

For example, the sensor arrangement has a first sensor and a second sensor which is arranged at a distance from the first sensor. The first sensor may be the sensor whose frequency response is intended to be optimized. However, it is not necessarily required for the frequency response of the second sensor to also be optimized, for example if the frequency response of the second sensor corresponds or substantially corresponds to the spectral mask. Alternatively, the frequency response of the second sensor may be used as a spectral mask for the first sensor.

This makes it possible to reduce the fluctuation or deviation of the frequency response of sensors of the sensor arrangement in a sensor-specific manner. This makes it possible to improve the precision or resolution of a sensor arrangement having a plurality of sensors.

In example 3, the subject matter according to example 2 may also include the fact that the signals S0 from a plurality of sensors 202 of the sensor arrangement are changed with respect to a common predefined spectral mask.

This makes it possible to reduce the fluctuation or deviation of the frequency response of the sensors of the sensor arrangement in a sensor-specific manner. This makes it possible to improve the precision or resolution of a sensor arrangement having a plurality of sensors.

In example 4, the subject matter according to one of examples 1 to 3 may also include the fact that at least one sensor 202 of the sensor arrangement has a diaphragm, a deflection of the diaphragm from a rest position generating the analog signal S0.

In example 5, the subject matter according to example 4 may also include the fact that the diaphragm is or has a micro-electromechanical structure.

In example 6, the subject matter according to one of examples 1 to 5 may also include the fact that the calibration filter 208 is a programmable calibration filter 208.

As a result, different sensor-specific control signals can be transmitted to the calibration filter and different filter coefficients can therefore be set. This makes it possible to use the calibration filter for a multiplicity of different sensors.

In example 7, the subject matter according to one of examples 1 to 6 may also include the fact that the calibration filter 208 is a recursive calibration filter 208.

In example 8, the subject matter according to one of examples 1 to 7 may also include the fact that the calibration filter 208 has at least two filter coefficients b0, b1, for example three filter coefficients a0, b0, b1.

Two filter coefficients may be sufficient if the frequency response of the sensor is already in the vicinity of the spectral mask. This enables efficient and easier calibration. Greater deviations from the spectral mask may also be compensated for by means of three or more filter coefficients.

In example 9, the subject matter according to one of examples 1 to 8 may also include the fact that the circuit arrangement 200 is in the form of a pressure sensor arrangement.

In example 10, the subject matter according to one of examples 1 to 9 may also include the fact that the circuit arrangement 200 is in the form of a microphone arrangement.

In example 11, the subject matter according to example 10 may also include the fact that the microphone arrangement has an arrangement of a plurality of microphones, the microphones being set up as sensors 202 of the sensor arrangement.

In example 12, the subject matter according to one of examples 1 to 11 may also include the fact that the filter arrangement 210 has at least one of the following filters or filter functions: a frequency-selective filter, e.g. a pass filter and/or a rejection filter; a decimation filter, an interpolation filter, a filter for reducing the group delay.

This makes it possible to change the signal to be provided by the circuit arrangement in an application-specific manner in order to comply with a predefined specification.

In example 13, the subject matter according to one of examples 1 to 12 may also have a modulator 212 which is connected to the analog/digital converter 202 and is set up to provide a third signal S3 based on the calibrated signal kS.

This makes it possible to set the word width of the provided signal, for example to provide a single-bit or multi-bit signal.

In example 14, the subject matter according to one of examples 1 to 13 may also have an interface 214 for providing a fourth signal S4 which is based on the second signal S2, the interface 214 being set up to provide an environment outside the circuit arrangement with the fourth signal S4.

In example 15, the subject matter according to example 14 may also include the fact that the fourth signal S4 is a single-bit signal.

In example 16, the subject matter according to example 14 may also include the fact that the fourth signal S4 is a multi-bit signal.

In example 17, the subject matter according to one of examples 1 to 16 may also include the fact that the sensor-specific control signal SS is dependent on a measured or estimated property of the sensor SE with respect to a predefined amplitude response, a predefined phase response and/or a predefined group delay.

In example 18, the subject matter according to example 17 may also include the fact that the control unit 206 has a memory or is connected to the latter. The memory stores the plurality of control signals SS. The control unit 206 is set up to select one of the plurality of control signals SS as a sensor-specific control signal SS depending on the measured or estimated property of the sensor SE and to provide the calibration filter 208 with said signal.

The filter coefficients may be transmitted to the calibration filter by means of the control signal. Alternatively or additionally, the calibration filter has a memory which stores different sets of filter coefficients. In this case, the control signal transmits a signal indicating which of the stored or held sets of filter coefficients is intended to be selected.

In example 19, the subject matter of one of examples 1 to 18 may also include the fact that the calibration filter receives the signal provided by the filter arrangement.

In example 20, the subject matter of one of examples 1 to 18 may also include the fact that the filter arrangement receives the calibrated signal (kS) provided by the calibration filter. The filter arrangement may have a decimation filter, for example, as a result of which the sampling rate of the signal received by the filter arrangement can be reduced and the calibration by the calibration filter can therefore be simplified.

In example 21, the subject matter of one of examples 1 to 19 may also have the sensor arrangement having at least one sensor 202 which is set up to provide the analog signal S0.

In example 22, the subject matter of one of examples 1 to 20 may also have the analog/digital converter 204 which is set up to receive the analog signal S0 and to provide the first signal S1.

In other words: the circuit arrangement 200 has the sensor arrangement having at least one sensor 202 which is set up to provide the analog signal S0; the analog/digital converter 204 set up to receive the analog signal S0 and to provide the first signal S1; the calibration filter 208 set up to receive the signal based on the first signal S1 and to provide a calibrated signal kS; the filter arrangement 210 set up to receive the signal based on the first signal S1 and to provide the second signal S2; and the control unit 206 set up to select the sensor-specific control signal SS dependent on the frequency response of the sensor from the plurality of control signals SS and to provide the calibration filter 208 with said signal. The calibrated signal kS is based on the first signal S1 and on the sensor-specific control signal SS and corresponds or substantially corresponds to a predefined spectral mask in a predefined frequency range.

Example 23 which is illustrated in connection with FIGS. 1 to 4C is a method 350 for calibrating a circuit arrangement 200. The circuit arrangement 200 has at least one sensor 202 which is set up to provide a signal S0. The method includes detecting K1 a property SE of a sensor of the sensor arrangement; determining K2 a control signal SS from a multiplicity of control signals on the basis of the detected property and a predefined spectral mask; and changing K3 the signal based on the sensor signal and made available to the calibration filter by means of the control signal SS in order to provide a calibrated signal, the control signal causing recursive processing of the provided signal with at least two signal coefficients.

In example 24, the subject matter according to example 23 may also include the fact that the circuit arrangement 200 is designed according to one of examples 1 to 22.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A circuit arrangement, comprising:
a calibration filter set up to receive a signal based on a first signal and to provide a calibrated signal;
the first signal being a signal which is provided by an analog/digital converter and is based on an analog signal, the analog signal being provided by at least one sensor of a sensor arrangement,
a filter arrangement set up to receive a signal based on the first signal and to provide a second signal; and
a controller set up to select a sensor-specific control signal dependent on the frequency response of the sensor from a plurality of control signals and to provide the calibration filter with the sensor-specific control signal, the calibrated signal being based on the first signal and the sensor-specific control signal and corresponding or substantially corresponding to a predefined spectral mask in a predefined frequency range.

2. The circuit arrangement of claim 1,
wherein the sensor arrangement comprises a plurality of sensors which each provide an analog signal, at least one signal from a sensor being changed with respect to the predefined spectral mask.

3. The circuit arrangement of claim 2,
wherein the signals from a plurality of sensors of the sensor arrangement are changed with respect to a common predefined spectral mask.

4. The circuit arrangement of claim 1,
wherein at least one sensor of the sensor arrangement comprises a diaphragm, a deflection of the diaphragm from a rest position generating the analog signal.

5. The circuit arrangement of claim 4,
wherein the diaphragm is or comprises a micro-electromechanical structure.

6. The circuit arrangement of claim 1,
wherein the calibration filter is a programmable calibration filter.

7. The circuit arrangement of claim 1,
wherein the calibration filter is a recursive calibration filter.

8. The circuit arrangement of claim 1,
wherein the calibration filter comprises at least two filter coefficients.

9. The circuit arrangement of claim 8,
wherein the calibration filter comprises at least three filter coefficients.

10. The circuit arrangement of claim 1,
wherein the circuit arrangement is in the form of a pressure sensor arrangement.

11. The circuit arrangement of claim 1,
wherein the circuit arrangement is in the form of a microphone arrangement.

12. The circuit arrangement of claim 11,
wherein the microphone arrangement comprises an arrangement of a plurality of microphones;
wherein the microphones are set up as sensors of the sensor arrangement.

13. The circuit arrangement of claim 1,
wherein the filter arrangement comprises at least one of the following filters or filter functions: a frequency-selective filter.

14. The circuit arrangement of claim 1, further comprising:
a modulator which is connected to the analog/digital converter and is set up to provide a third signal based on the calibrated signal.

15. The circuit arrangement of claim 1, further comprising:
an interface configured to provide a fourth signal which is based on the second signal;
wherein the interface is set up to provide an environment outside the circuit arrangement with the fourth signal.

16. The circuit arrangement of claim 15,
wherein the fourth signal is a single-bit signal.

17. The circuit arrangement of claim 15,
wherein the fourth signal is a multi-bit signal.

18. The circuit arrangement of claim 1,
wherein the sensor-specific control signal is dependent on a measured or estimated property of the sensor with respect to at least one of a predefined amplitude response, a predefined phase response, or a predefined group delay.

19. The circuit arrangement of claim 18,
wherein the control unit either comprises a memory or is connected to a memory;
wherein the memory storing the plurality of control signals and the controller are set up to select one of the plurality of control signals as the sensor-specific control signal depending on the measured or estimated property of the sensor and to provide the calibration filter with the sensor-specific control signal.

20. The circuit arrangement of claim 1,
wherein the calibration filter is configured to receive the signal provided by the filter arrangement.

21. The circuit arrangement of claim 1,
wherein the filter arrangement is configured to receive the calibrated signal provided by the calibration filter.

22. The circuit arrangement of claim 1,
wherein the sensor arrangement comprises at least one sensor which is set up to provide the analog signal.

23. The circuit arrangement of claim 1, further comprising:
the analog/digital converter set up to receive the analog signal and to provide the first signal.

24. A method of calibrating a circuit arrangement,
the circuit arrangement comprising a calibration filter and at least one sensor which is set up to provide a sensor signal;
the method comprising:
detecting a property of a sensor of the at least one sensor;
determining a sensor-specific control signal from a multiplicity of control signals on the basis of the detected property and a predefined spectral mask; and
providing a calibrated signal from the calibration filter based on the sensor signal as modified by the sensor-specific control signal, the sensor-specific control signal causing recursive processing with at least two signal coefficients.

25. The method of claim 24,
wherein the circuit arrangement comprises:
the calibration filter set up to receive a first signal based on the sensor signal and to provide the calibrated signal;

the first signal being a signal which is provided by an analog/digital converter and is based on an analog signal, the analog signal being based on the sensor signal, a filter arrangement set up to receive a signal based on the first signal and to provide a second signal; and a controller set up to select the sensor-specific control signal dependent on the frequency response of the sensor from the multiplicity of control signals and to provide the calibration filter with the sensor-specific control signal, the calibrated signal being based on the first signal and the sensor-specific control signal and corresponding or substantially corresponding to a predefined spectral mask in a predefined frequency range.

* * * * *